United States Patent
Sun et al.

(10) Patent No.: US 9,991,161 B1
(45) Date of Patent: Jun. 5, 2018

(54) ALTERNATE PLATING AND ETCHING PROCESSES FOR THROUGH HOLE FILLING

(71) Applicant: Hong Kong Applied Science and Technology Research Institute Company Limited, Hong Kong (HK)

(72) Inventors: Yaofeng Sun, Hong Kong (HK); Sha Xu, Hong Kong (HK); Shu Kin Yau, Hong Kong (HK)

(73) Assignee: Hong Kong Applied Science and Technology Research Institute Company Limited, Hong Kong (HK)

( * ) Notice: Subject to any disclaimer, the term of this patent is extended or adjusted under 35 U.S.C. 154(b) by 0 days. days.

(21) Appl. No.: 15/451,566

(22) Filed: Mar. 7, 2017

(51) Int. Cl.
   *H01L 21/44* (2006.01)
   *H01L 21/768* (2006.01)
   *H01L 21/288* (2006.01)
   *H01L 21/3205* (2006.01)
   *H01L 21/3213* (2006.01)

(52) U.S. Cl.
   CPC ...... *H01L 21/76898* (2013.01); *H01L 21/288* (2013.01); *H01L 21/2885* (2013.01); *H01L 21/32051* (2013.01); *H01L 21/32134* (2013.01); *H01L 21/76879* (2013.01)

(58) Field of Classification Search
   CPC .................. H01L 21/76898; H01L 21/288
   USPC ......................................................... 438/667
   See application file for complete search history.

(56) References Cited

U.S. PATENT DOCUMENTS

| | | | |
|---|---|---|---|
| 6,664,485 | B2 | 12/2003 | Bhatt et al. |
| 7,850,836 | B2 | 12/2010 | Dixit et al. |
| 8,722,539 | B2 | 5/2014 | Reid et al. |
| 9,029,711 | B2 | 5/2015 | Ikeda |
| 2001/0002294 | A1 | 5/2001 | Akihito et al. |
| 2005/0064707 | A1 | 3/2005 | Sinha |

(Continued)

FOREIGN PATENT DOCUMENTS

| | | |
|---|---|---|
| CN | 102412195 A | 4/2012 |
| CN | 103219278 A | 7/2013 |

(Continued)

OTHER PUBLICATIONS

International Search Report of the corresponding PCT application (No. PCT/CN2017/076871), dated Dec. 14, 2017.

*Primary Examiner* — Jami M Valentine
(74) *Attorney, Agent, or Firm* — Spruson & Ferguson (Hong Kong) Limited (57) ABSTRACT

A method for filling a through hole (TH) located on a substrate is provided. The TH is a continuous channel having an upper rim, a lower rim and an interior surface. In one embodiment, the method comprises steps (a)-(d). In the step (a), a conductive material (CM) is deposited over the substrate to thereby deposit a layer of the CM around the rims and on the interior surface. In the step (b), the deposited CM is etched. In particular, the etching step selectively removes more CM deposited at the rims relative to CM deposited at a mid-section of the interior surface of the channel. In the step (c), the steps (a) and (b) are optionally repeated until the channel is sealed at the mid-section by a bridge formed of CM. In the step (d), the CM is further deposited over the substrate to thereby completely fill the TH.

20 Claims, 8 Drawing Sheets

(56) References Cited

U.S. PATENT DOCUMENTS

| | | | |
|---|---|---|---|
| 2011/0278648 A1* | 11/2011 | Schmidt | B26F 1/28 |
| | | | 257/202 |
| 2013/0048198 A1* | 2/2013 | Hall | H05K 1/184 |
| | | | 156/182 |
| 2013/0149864 A1 | 6/2013 | Noguchi | |
| 2014/0246325 A1 | 9/2014 | Tsuchiya et al. | |
| 2014/0338965 A1 | 11/2014 | Kajihara | |
| 2016/0105975 A1 | 4/2016 | Jayaraju et al. | |

FOREIGN PATENT DOCUMENTS

| | | |
|---|---|---|
| CN | 103594386 | 2/2014 |
| CN | 105683406 | 6/2016 |

* cited by examiner

FIG. 1A

*Funnel-shaped deposit*

FIG. 1B

*Butterfly-shaped deposit*

ALTERNATE PLATING AND ETCHING PROCESSES FOR THROUGH HOLE FILLING

FIELD OF THE INVENTION

The present invention generally relates to electrodeposition of a conductive material (CM) in a through hole (TH) of a substrate. In particular, the present invention relates to void-free filling of the TH.

BACKGROUND

Using ceramic substrates for high-power applications has become popular in fabricating power modules, high-power light emitting diodes (LEDs), power inverters for electrical machines, electrical chargers, etc. In the design of high-density interconnects for the ceramic substrates, the demand for finer pattern formation on the substrates has favored filled holes and copper pillars instead of plugged holes. Closely-spaced THs each having a small diameter are prepared on a typical substrate, and the THs are filled with a CM. Filling the THs without creating any void therein is highly desirable.

An electrochemical material filling process is usually used for TH filling. Certain process parameters, such as the TH's diameter, an aspect ratio (AR) of the TH, deposit processing time, have to be considered. In general, industrial requirements on the TH diameter, AR of hole, deposit processing time are 50-150 μm, 2-5, and less than or around 4 hours, respectively. In a TH with a high AR value, for example 4-5, the current density does not remain uniform along a depth of the TH during an electroplating process. The current density at each of the two ends of the TH, is typically higher than the current density at the center of the TH. Due to a higher current density, the rates of metal deposition at the two ends are greater than the deposition rate at the center. Because of uneven deposition of the metal, the two ends of the TH finally become blocked, thereby forming a void at the center.

In the art, e.g., US2014/0338965A1, the butterfly-mode plating is used to avoid formation of the void at the center of the TH. In the butterfly-mode plating, a metal or a CM in general is electroplated to an interior surface of the TH to form a butterfly-shaped deposit against the interior surface. The butterfly-shaped deposit closes an interior channel of the TH. After the butterfly-shaped deposit is formed, a conventional electroplating technique can be used to fill up the TH by depositing the CM to the butterfly-shaped deposit.

Despite the butterfly-mode plating can be used to fill the TH without any void therein, the Inventors have observed that the current density used for forming the butterfly-shaped deposit is required to be lower than a certain threshold value, and this threshold value is practically low. Overdriving the current density prevents the formation of butterfly-shaped deposit. Thus, the processing time to form the butterfly-shaped deposit is relatively long, increasing the time cost in TH filling.

There is a need in the art to have a technique for filling up the TH filling by first forming a butterfly-shaped deposit therein at a speed higher than that required by existing techniques of building the butterfly-shaped deposit.

SUMMARY OF THE INVENTION

An aspect of the present invention is to provide a method for filling a TH located on a substrate. Said TH is a continuous channel having an upper rim, a lower rim and an interior surface. The method comprises steps (a)-(d). In the step (a), a CM is deposited over said substrate to thereby deposit a layer of the CM around the rims and on the interior surface of said channel. In the step (b), said deposited CM is etched, wherein the etching step selectively removes more CM deposited at the rims relative to CM deposited at a mid-section of the interior surface of said channel. In the step (c), the steps (a) and (b) are optionally repeated until the channel is sealed at the mid-section by a bridge formed of CM. In the step (d), said CM is further deposited over said substrate to thereby completely fill said TH.

Preferably, the step (b) comprises agitating an etchant such that more CM deposited at the rims is selectively removed relative to CM deposited at the mid-section. The etchant may be agitated to have flow rates at the rims greater than a flow rate at the mid-section such that etch rates of etching CM deposited at the rims are greater than an etch rate of etching CM at the mid-section. It is preferable that the etchant is agitated such that both the etch rates at the rims are greater than or equal to two times of the etch rate at the mid-section. In one embodiment, the agitating step in the step (b) further comprises directing the etchant to each of the rims at an oblique angle predetermined to create the flow rates at the rims greater than the flow rate at the mid-section.

In the step (a), the CM may be deposited over said substrate by conformal plating or by butterfly-mode pulse reverse plating. If said TH is substantially cylindrical in shape, conformal plating is preferably used when an AR, given by a height to a diameter of said TH, is between two to three inclusively. When the AR is between four to five inclusively, butterfly-mode pulse reverse plating is preferable.

In the step (d), preferably said CM is further deposited over said substrate by blind via filling.

The method may further include a step (e) of depositing a seed layer of CM onto said substrate by electroless plating before the step (a) is performed.

Other aspects of the present invention are disclosed as illustrated by the embodiments hereinafter.

DETAILED DESCRIPTION

Figure 1A:
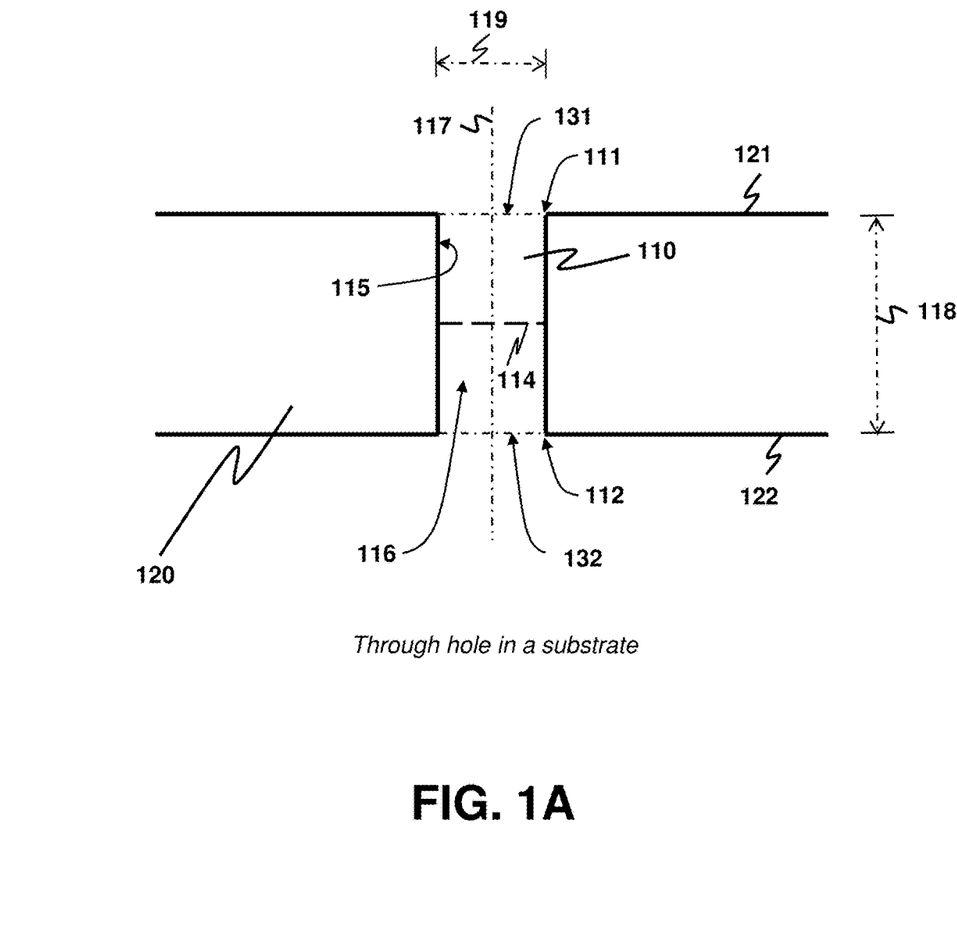
FIG. 1A depicts a TH located on a substrate for illustrating different parts of the TH.

Terminologies used herein for describing different parts of a TH located on a substrate are first illustrated with an aid of FIG. 1A, which depicts a cross-sectional view of a TH 110 located on a substrate 120. The substrate 120 has a first surface 121 and a second surface 122 opposite to the first surface 121. The TH 110 penetrates through the substrate 120 and extends from the first surface 121 to the second surface 122. The TH 110 has a first end 131 on the first surface 121 and a second end 132 on the second surface 122. The TH 110 forms a continuous channel 116, and has an upper rim 111, a lower rim 112 and an interior surface 115. The upper rim 111 is a boundary of the first end 131, and the lower rim 112 is a boundary of the second end 132. In the middle of the TH 110, there is a mid-section 114 substantially equidistant from the first end 131 and the second end 132. The mid-section 114 is a cross-section substantially perpendicular to a major axis 117 of the TH 110. The TH 110 has a height 118. Usually, the TH 110 has a substantially cylindrical shape. In this case, the TH 110 has a diameter 119.

Figure 1B:
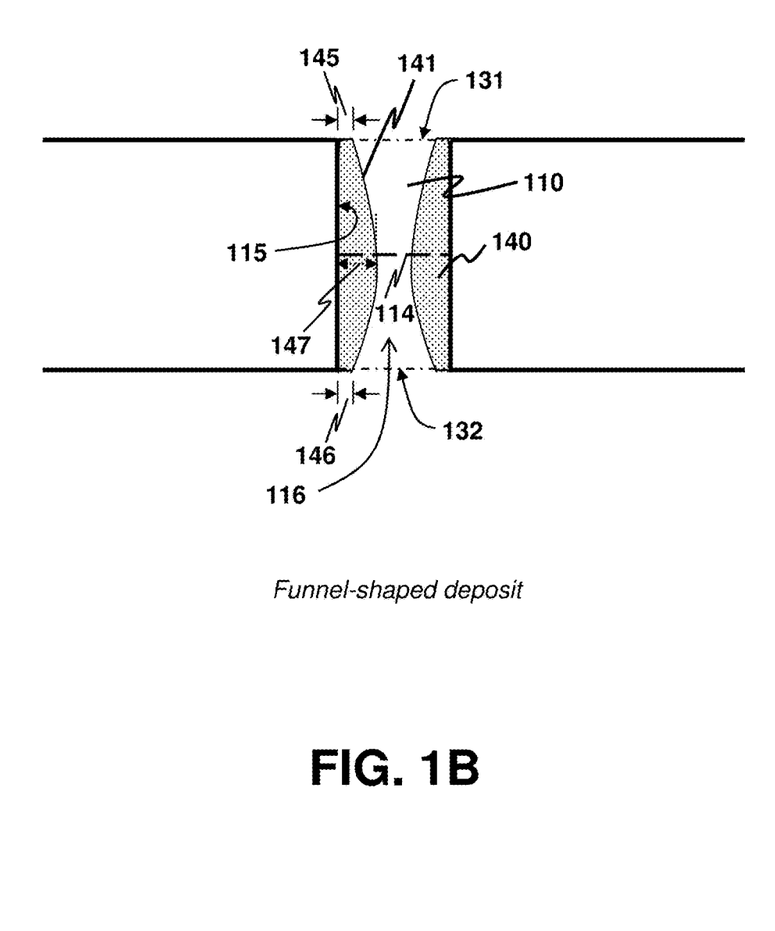
FIG. 1B depicts a cross-sectional view of a funnel-shaped deposit as an example for illustration.
Figure 1C:
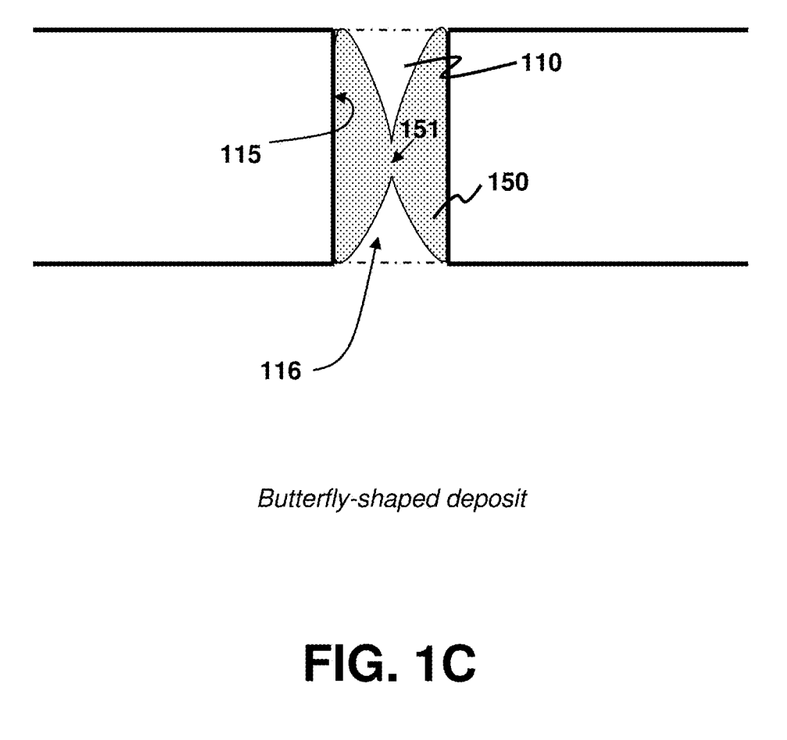
FIG. 1C depicts a cross-sectional view of a butterfly-shape deposit as another illustrative example.

Other terminologies that are used herein include a funnel-shaped deposit and a butterfly-shaped deposit, each being a deposit of some CM in a TH. FIGS. 1B and 1C depict cross-sectional views of a funnel-shaped deposit 140 and a butterfly-shaped deposit 150, respectively, each residing in the TH 110 as illustrative examples. Note that in most practical situations, the first and second surfaces 121, 122 are each deposited with a layer of CM during electroplating, but for clarity, this CM layer is not shown in FIGS. 1B and 1C. The funnel-shaped deposit 140 is deposited on the interior surface 115, and the channel 116 is not blocked by the funnel-shaped deposit 140. The channel 116 is still open between the first end 131 and the second end 132. The funnel-shaped deposit 140 has a shape looking like a funnel. More exactly, the cross-sectional view of the funnel-shaped deposit 140 has a contour 141 looking like a funnel. The butterfly-shaped deposit 150 is also deposited on the interior surface 115 but different from the funnel-shaped deposit 140, the channel 116 is sealed or blocked by a bridge 151 of CM. The butterfly-shaped deposit 150 has a cross-sectional view looking like a butterfly.

In the description of the present invention, "an etch rate," "a deposition rate" and "an amount of CM growth" at a certain section of the TH 110 are often referred to, where the aforesaid certain section is the first end 131, the second end 132 or the mid-section 114. Herein in the specification and appended claims, the etch rate, the deposition rate and the amount of CM growth at a certain section are measured by reference to a depth of CM slice formed by intersecting a deposit under consideration with the aforesaid certain section. Refer to FIG. 1B and consider the funnel-shaped deposit 140 as an example. A first depth 145 is used as a reference for measuring the etch rate, the deposition rate and the amount of CM growth when the aforesaid certain section is the first end 131. Similarly, a second depth 146 is used as the reference when the second end 132 is considered, and a third depth 147 is used as the reference if the mid-section 114 is considered.

An aspect of the present invention is to provide a method for filling the TH 110 in the substrate 120 with a CM.

As mentioned above, the substrate 120 may be made of a ceramic material. In general, the substrate 120 is an insulator or at most a poor conductor with negligible conductivity. The CM may be copper or an alloy containing copper, may be a metal (e.g., silver and aluminum) or a metallic alloy, or may even be a semiconductor (e.g., zinc selenide).

Figure 2:
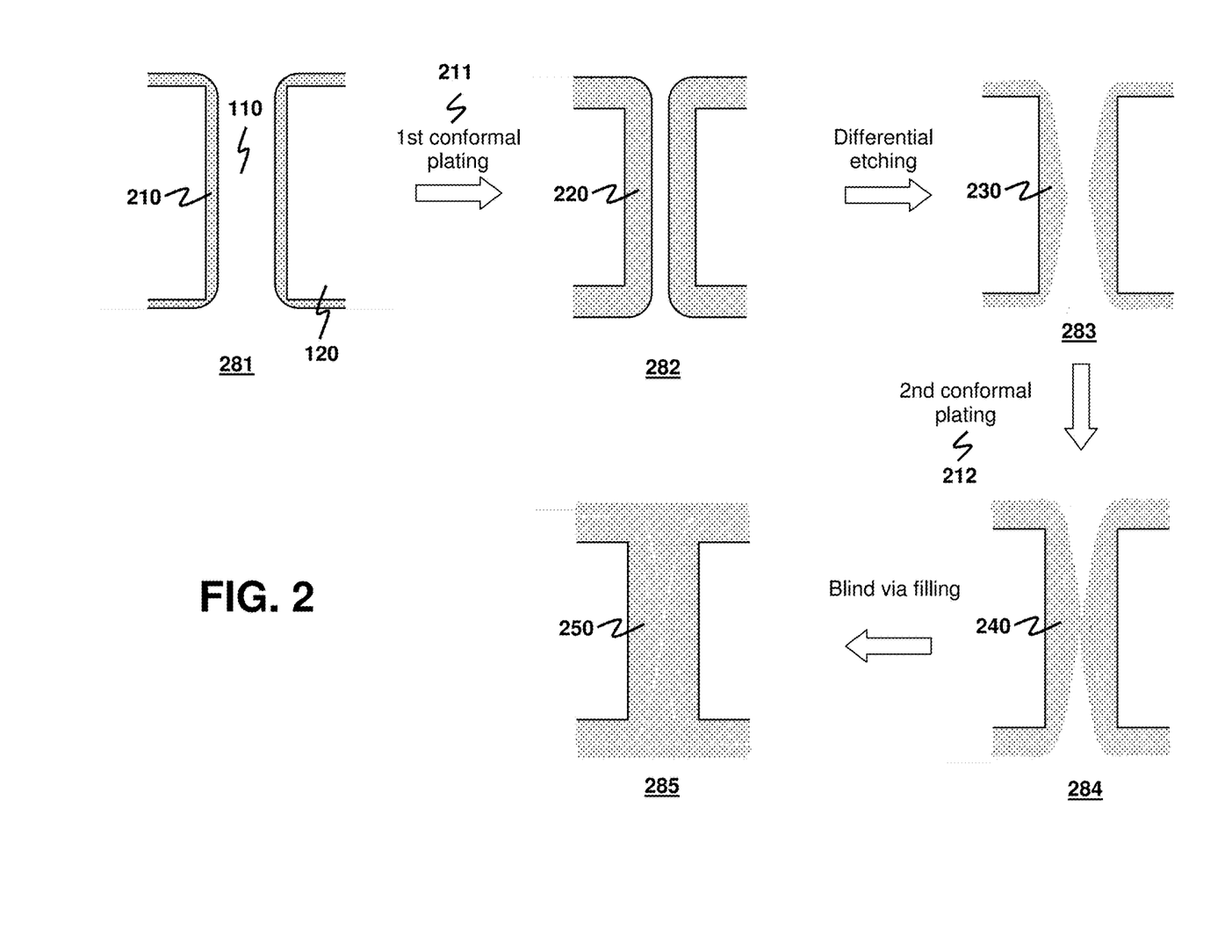
FIG. 2 depicts one practical realization of a method disclosed herein for filling the TH, where an etch-and-deposit process involves conformal plating.
Figure 3:
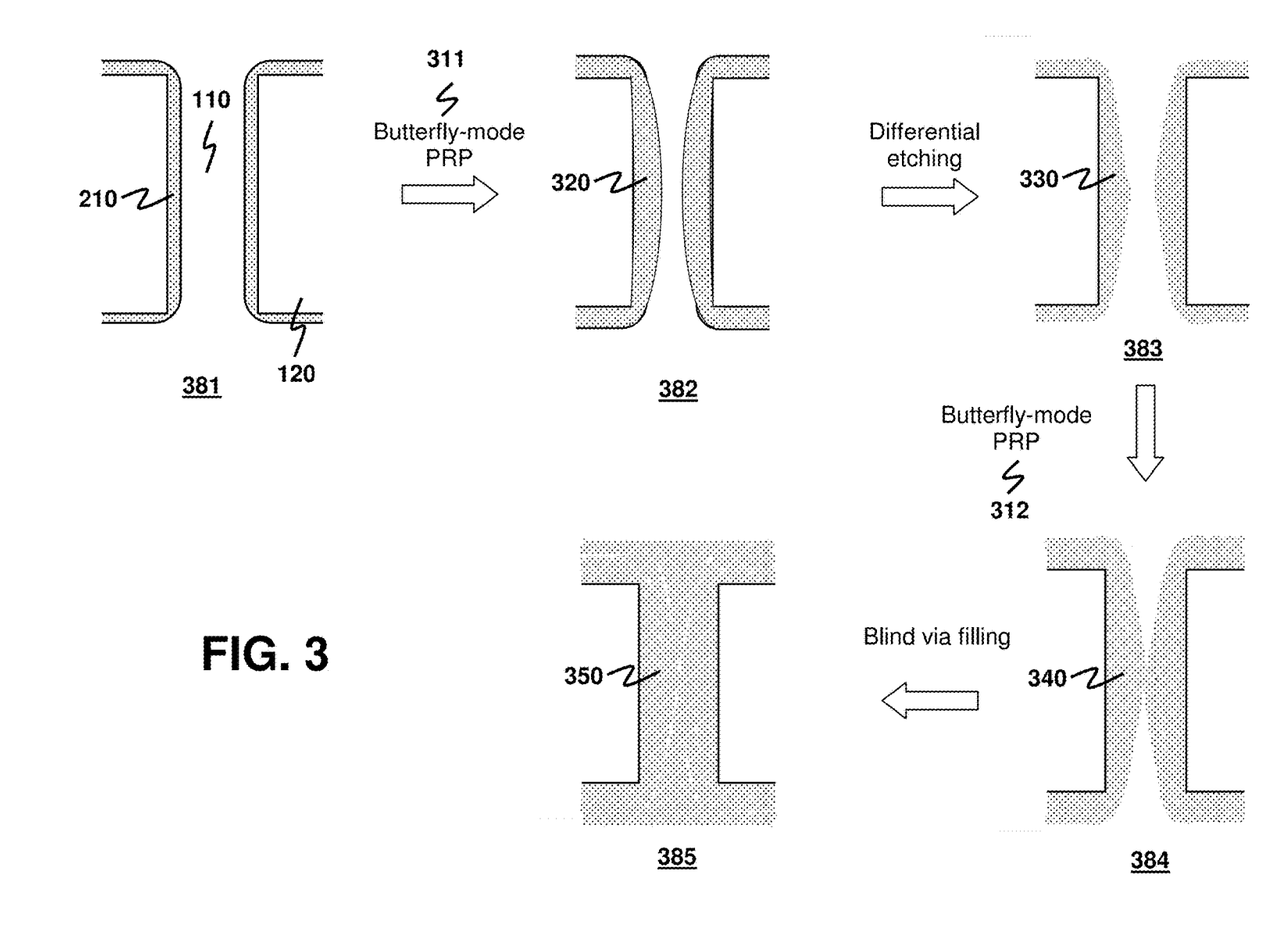
FIG. 3 depicts another practical realization of the method, where the etch-and-deposit process involves butterfly-mode PRP.
Figure 6:
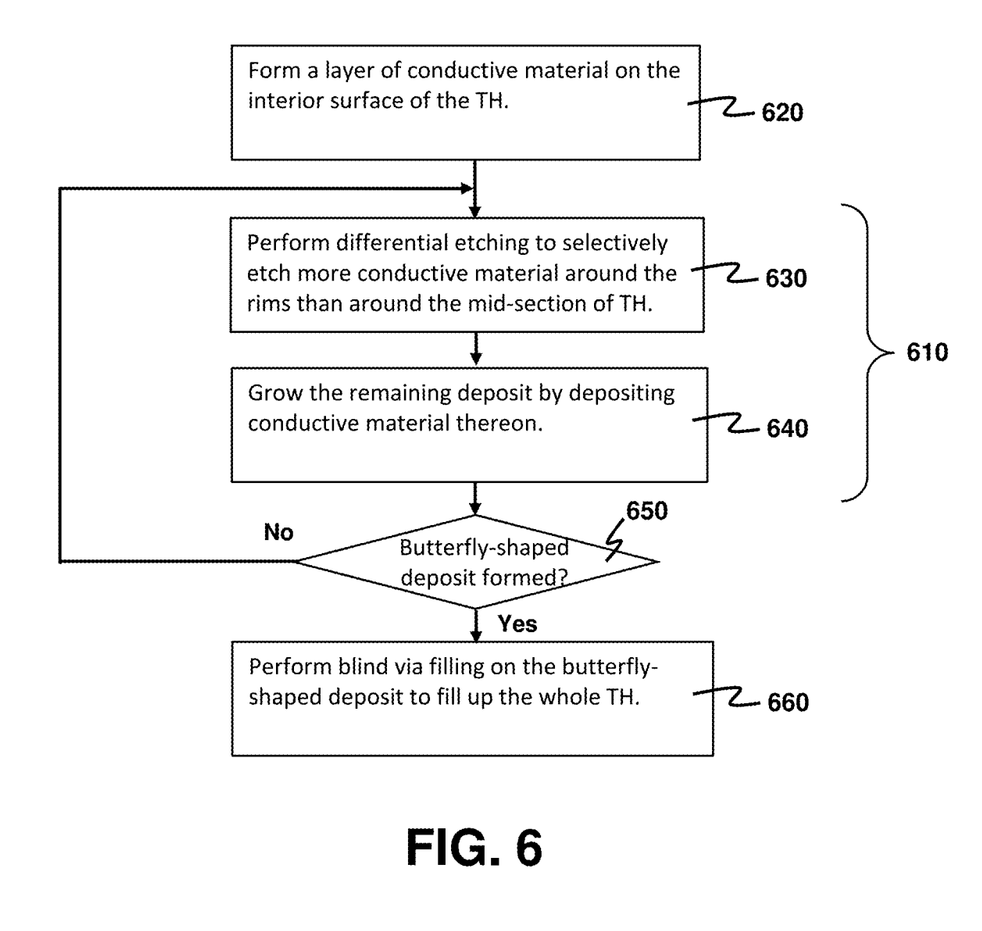
FIG. 6 depicts a flowchart showing a processing flow of a method for filling the TH in accordance with an exemplary embodiment of the present invention.

The method is detailed with an aid of FIGS. 6, 2 and 3. FIG. 6 depicts a flowchart showing a processing flow of the method in accordance with an exemplary embodiment of the present invention. FIGS. 2 and 3 depict two different practical realizations of the method.

The realization as shown in FIG. 2 involves conformal plating. Conformal plating means a plating process such that the CM deposited onto an object (e.g., the substrate 120 or the TH 110) conforms to the contour of the object. That is, the growth rate of CM is substantially uniform over the object's surface. This realization is preferably used if the TH 110 is substantially cylindrical and has an AR between two to three inclusively. The AR is given by the height 118 to the diameter 119 of the TH 110. The other realization shown in FIG. 3 involves butterfly-mode pulse reverse plating (PRP), and is preferably used when the AR is between four to five inclusively. For details on PRP, refer to, e.g., M. S. Chandrasekar and M. Pushpavanan, "Pulse and pulse reverse plating—Conceptual, advantages and applications," *Electrochimica Acta*, vol. 53, pp. 3313-3322, 2008, the disclosure of which is incorporated by reference herein.

Refer to FIG. 6. A main innovative part of the method is an etch-and-deposit process 610 comprising a differential etching step 630 followed by a deposit growing step 640. The goal of the etch-and-deposit process 610 is, by performing this process 610 one or more times, to form a butterfly-shaped deposit with an advantage of reducing the time to form this deposit in comparison to the conventional butterfly-mode plating. Hence, the butterfly-shaped deposit may be formed by performing alternate plating and etching processes.

Before the etch-and-deposit process 610 is performed, the TH 110 is processed to form a layer of CM on the interior surface 115 of the TH 110 without closing off the channel 116 (step 620). The layer of CM is also deposited around the upper rim 111 and the lower rim 112 of the TH 110. Two non-limiting realizations of the step 620 are respectively shown on subplots 281 and 282 of FIG. 2 and on subplots 381 and 382 of FIG. 3. In the first realization, a seed layer 210 of CM is deposited onto the substrate 120 and also on the interior surface 115 of the TH 110 (shown in the subplot 281). As the substrate 120 is at least poor in conductivity, the seed layer 210 is usually grown by electroless plating. Those skilled in the art can easily identify relevant electroless-plating methods for different kinds of substrate and CM. The seed layer 210 is then grown to form the aforesaid layer of CM (indicated as layer 220 in the subplot 282) by fast conformal plating 211 under a high current. In the second realization, the seed layer 210 is first grown on the TH 110 by the same process of the first realization (the subplot 381 being the same as the subplot 281). The seed layer 210 is then grown to the aforesaid layer of CM (indicated as layer 320 in the subplot 382) by butterfly-mode PRP 311.

The etch-and-deposit process 610 is then used one or more times to form a butterfly-shaped deposit (indicated as a deposit 240 in a subplot 284 or another deposit 340 in a subplot 384) from the aforesaid layer of CM (220 or 320). In particular, the etch-and-deposit process 610 is recursively performed until the channel 116 is closed (step 650), whereby the butterfly-shaped deposit (240 or 340) is formed. For simplicity, FIGS. 2 and 3 show only one round of the etch-and-deposit process 610 in forming the butterfly-shaped deposit (240 or 340). The etch-and-deposit process 610 for forming a next deposit of CM on the interior surface 115 from an original deposit of CM thereon is elaborated as follows.

The goal of the etch-and-deposit process 610 is that when the next deposit is compared against the original deposit in assessing the growth of CM, an amount of CM growth at the mid-section 114 is greater than both amounts of CM growth at the first end 131 and at the second end 132. In this way, the mid-section 114 is quicker to be sealed by CM than each of the first and second ends 131, 132 is.

The differential etching step 630 of the etch-and-deposit process 610 selectively removes more CM deposited at the upper and lower rims 111, 112 relative to CM deposited at the mid-section 114. In the differential etching step 630, an etchant is used to differentially etch the original deposit in a sense that a non-uniform distribution of etch rate along the height 118 of the TH 110 is obtained. The desired result of the differential etching step 630 is to have both the etch rates at the first and second ends 131, 132 greater than the etch rate at the mid-section 114. By the step 630, the original deposit is reshaped to form an intermediate deposit of CM having a funnel shape (indicated as funnel-shaped deposits 230, 330 in subplots 283, 383). Note that the etch-and-deposit process 610 bears the same procedure for both the realizations shown in FIGS. 2 and 3.

Figure 4:
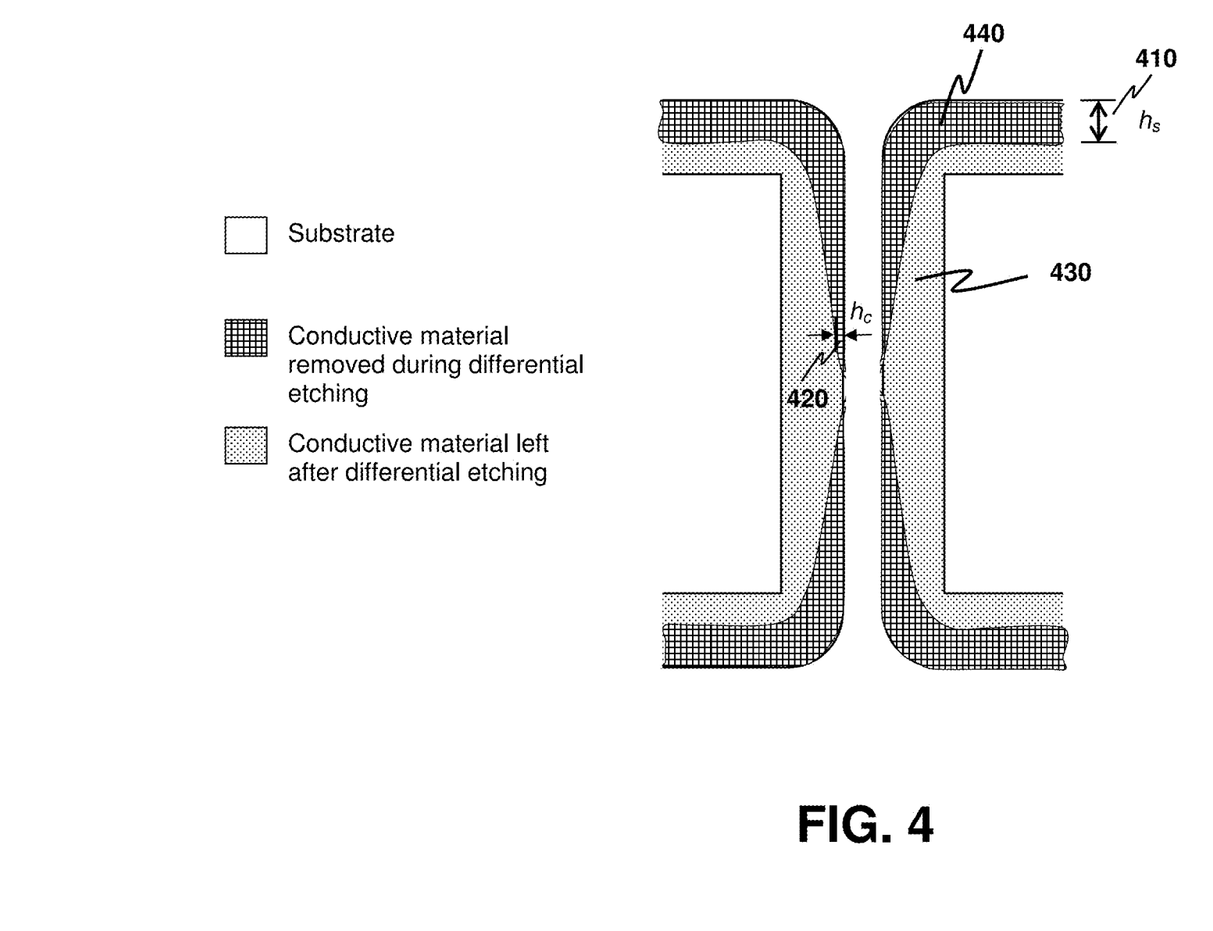
FIG. 4 illustrates removal of CM from a deposit in the TH in differential etching.

FIG. 4 illustrates the removal of CM from the original deposit. The original deposit is a combination of an intermediate deposit of CM 430 and a block of CM 440 removed in the differential etching step 630. The depth of CM (in the block 440) removed over the first surface 121 is denoted as $h_s$ 410. The width of CM (also in the block 440) removed in the mid-section 114 is denoted as $h_c$ 420. By differential etching, $h_s$ 410 is substantially greater than $h_c$ 420. Preferably, $h_s$ 410 is at least two times of $h_c$ 420 in order to quickly obtain a funnel shape for the intermediate deposit 430. Thus, it is preferable that both the etch rates at the upper and lower rims 111, 112 (or equivalently, the etch rate at the first end 131 and the etch rate at the second end 132) are greater than or equal to two times of the etch rate at the mid-section 114.

Refer to FIG. 6 again. After the intermediate deposit (230 or 330) is obtained from the step 630, the intermediate deposit (230 or 330) is grown by further depositing the CM thereon (the deposit growing step 640) to thereby yield the next deposit. The growth of the intermediate deposit (230 or 330) is done by an electrodeposition process.

Preferably, the electrodeposition process is configured such that a deposition rate of CM at the mid-section 114 is not less than both deposition rates at the first end 131 and at the second end 132. By this arrangement in deposition rate, and as the differential etching step 630 has the etch rates at the first and second ends 131, 132 greater than the etch rate at the mid-section 114, the net result is that the above-mentioned goal of the etch-and-deposit process 610 is achieved. Both conformal plating 212 (FIG. 2) and butterfly-mode PRP 312 (FIG. 3) satisfy the aforementioned arrangement in deposition rate. The conformal plating 212 is preferred to be a fast one using a high current, thus reducing the plating time.

Nevertheless, the aforementioned arrangement in deposition rate is not necessarily a limitation of the present invention. It is possible that the deposition rates at the first end 131 and at the second end 132 are slightly higher than the deposition rate at the mid-section 114 provided that when taken into account the non-uniform distribution of etch rate in the differential etching step 630, the amount of CM growth at the mid-section 114 is greater than each of the amounts of CM growth at the first end 131 and at the second end 132 in the comparison between the next and original deposits. Let $g_1$, $g_2$ and $g_3$ denote the amounts of CM growth at the first end 131, at the second end 132 and at the mid-section 114, respectively. It follows that $g_1$, $g_2$ and $g_3$ are given by $$g_1 = d_1 \times t_{deposition} - e_1 \times t_{etch},$$

$$g_2 = d_2 \times t_{deposition} - e_2 \times t_{etch},$$

and $$g_3 = d_3 \times t_{deposition} - e_3 \times t_{etch},$$

where: $d_1$, $d_2$ and $d_3$ are the deposition rates at the first end 131, the second end 132 and the mid-section 114, respectively; $e_1$, $e_2$ and $e_3$ are the etch rates at the first end 131, the second end 132 and the mid-section 114, respectively; $t_{deposition}$ ($t_{deposition} > 0$) is a deposition time of depositing CM onto the intermediate deposit during the electrodeposition process in the step 640; and $t_{etch}$ ($t_{etch} > 0$) is an etching time of differentially etching the original deposit in the step 630. In general, $d_1$, $d_2$, $d_3$, $e_1$, $e_2$, $e_3$, $t_{deposition}$ and $t_{etch}$ are selected such that $g_3 > g_1$ and $g_3 > g_2$ under constraints that $e_1 > e_3$ and $e_2 > e_3$. Note that in the special case of selecting $d_3 > d_1$ and $d_3 > d_2$, the desired result of $g_3 > g_1$ and $g_3 > g_2$ is satisfied regardless of any choices of $t_{deposition}$ and $t_{etch}$.

During the differential etching in the step 630, an individual etch rate may fluctuate during the whole etching time. For example, a short transient period may be required to stabilize an etching rate at the beginning of etching, or the etch rate may randomly fluctuate around an average etch rate due to random factors. In most practical situations, the transient period is short relative to the whole etching time, and the random fluctuation in etch rate is small in comparison to the average etch rate. Those skilled in the art will appreciate that a representative etch rate can be obtained for the etching, e.g., an average etch rate over a portion of the etching time $t_{etch}$ over which the etch rate is considered approximately invariant. A similar observation also applies to an individual deposition rate of the electrodeposition process in the step 640. Those skilled in the art will also appreciate that a representative deposition rate can be obtained for the electrodeposition process, e.g., an average deposition rate over a portion of the deposition time $t_{deposition}$ over which the deposition rate is considered approximately invariant. Herein in the specification and appended claims, an etch rate and a deposition rate referred to in the etch-and-deposit process 610 are interpreted as a representative etch rate and a representative deposition rate, respectively, as elaborated above. The present invention is not limited to whether the representative etch/rate deposition rate is obtained by measurement or whether such representative rate is a predicted one obtained by computation or simulation.

After the butterfly-shaped deposit (240 or 340) is formed, blind via filling (step 660) is used to deposit the CM on the butterfly-shaped deposit (240 or 340) to form a final deposit (indicated as blocks of CM 250 and 350 respectively in subplots 285 and 385) that completely fills the TH 110 without any void therein. Those skilled in the art will appreciate that a quick electroplating method that can reliably deposit the CM onto the butterfly-shaped deposit (240 or 340) without introducing any void can be identified in the art. For illustration, one method is provided as follows. The substrate 120 is put in a bath of plating solution with plating additives for bottom up via filling. The solution and additives can be the same or different from the ones used in forming the butterfly-shaped deposit (240 or 340). The butterfly-shaped deposit (240 or 340) is supplied with a direct-current (DC) voltage during blind via filling. An air pump or a jet flow nozzle is used to regulate the flow of plating solution.

In practical implementation of the etch-and-deposit process 610, wet etching is preferred so that the etchant is in liquid form. The etchant usually comprises a reagent for etching away the CM, and one or more additives comprising one or more catalysts and one or more stabilizers. The reagent and the one or more additives are dissolved in water to form the etchant. Those skilled in the art will appreciate that the reagent and the one or more additives can be determined according to the CM and the knowledge in the art. As an example, if the CM is copper, the additives can be N-rich compounds with benzyl groups or other conjugated double bonds, or other hetero-atoms such as O and S. These compounds form stable chelation chemicals with copper ions, facilitating the differential etching.

In one embodiment, the non-uniform distribution of etch rate as obtained in the differential etching step 630 is generated by agitating the etchant. In particular, the agitating of the etchant is configured, or pre-designed, to create a first flow rate of etchant at the mid-section 114 different from a second flow rate of etchant at the first end 131 and a third flow rate of etchant at the second end 132 (i.e. a non-uniform distribution of etchant flow rate along the height 118 of the TH 110) such that the etch rates at the first and second ends 131, 132 are greater than the etch rate at the mid-section 114. The advantageous use of agitation to the etchant is because a higher flow rate enables more rapid removal of the CM detached from the original deposit as well as a higher rate of replacing depleted etchant in the vicinity of the original deposit.

Figure 5:
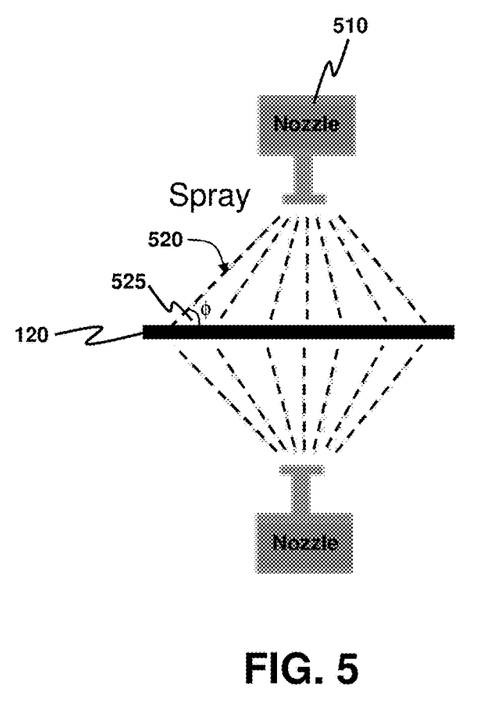
FIG. 5 depicts, in accordance with one embodiment of the present invention, an arrangement for spraying an etchant on the substrate in order to agitate the etchant for achieving differential etching.

In one option, the agitation of the etchant is achieved by spraying the etchant on the substrate 120 in a predetermined manner. FIG. 5 depicts an arrangement for spraying an etchant 520 on the substrate 120. The etchant 520 is ejected from a nozzle 510 with an oblique angle φ 525 when reaching the substrate 120. The oblique angle 525 is determined according to geometry of the substrate 120 and the TH 110.

In carrying out the butterfly-mode PRP 311 or 312, a set of functional additives (inhibitors/suppressor and accelerators/brightener) is often used. For illustration, examples of such functional additives for copper plating are provided as follows. The accelerators are sulfur-containing compounds that can accelerate zinc precipitation and shrink the copper crystal grain, making the surface of deposited copper bright. The inhibitors are usually polymeric linear ethylene glycols or propylene glycols or mixed glycols, which are surfactant and can help wet the surface on which copper is deposited as well as can be substituted by other additives.

The method for filling the TH 110 with the CM is extendable to filling plural THs located on the substrate 120. Each of said plural THs is filled with the CM according to any embodiment of the method disclosed above. Furthermore, said plural THs are filled concurrently.

The present invention may be embodied in other specific forms without departing from the spirit or essential characteristics thereof. The present embodiment is therefore to be considered in all respects as illustrative and not restrictive. The scope of the invention is indicated by the appended claims rather than by the foregoing description, and all changes that come within the meaning and range of equivalency of the claims are therefore intended to be embraced therein.

What is claimed is:

1. A method for filling a through hole (TH) in a substrate with a conductive material (CM), the substrate having a first surface and a second surface opposite thereto, the TH having an interior surface, a first end on the first surface, a second end on the second surface, and a mid-section in the middle of the TH, the method comprising:

coating the interior surface with a layer of CM without closing off a channel of the TH between the first and second ends;

forming, on the interior surface, a butterfly-shaped deposit of CM from the layer of CM by recursively performing an etch-and-deposit process until the channel is closed; and depositing the CM onto the butterfly-shaped deposit to completely fill the TH;

wherein the etch-and-deposit process for forming a next deposit of CM from an original deposit of CM comprises:

differentially etching the original deposit with a non-uniform distribution of etch rate along a height of the TH such that a first etch rate at the first end and a second etch rate at the second end are greater than a third etch rate at the mid-section, whereby an intermediate deposit of CM is obtained; and depositing CM onto the intermediate deposit to form the next deposit by an electrodeposition process having a first deposition rate at the first end, a second deposition rate at the second end and a third deposition rate at the mid-section, wherein the first, second and third etch rates, the first, second and third deposition rates, an etching time of differentially etching the original deposit and a deposition time of depositing CM onto the intermediate deposit are selected such that in comparison between the next and original deposits, an amount of CM growth at the mid-section is greater than both amounts of CM growth at the first end and at the second end.

2. The method of claim 1, wherein both the first and second etch rates are greater than or equal to two times of the third etch rate.

3. The method of claim 1, wherein:

the original deposit is differentially etched by a liquid etchant; and the non-uniform distribution of etch rate is generated by agitating the etchant, the agitating of the etchant being configured to create a first flow rate of etchant at the mid-section different from a second flow rate of etchant at the first end and a third flow rate of etchant at the second end such that both the first and second etch rates are greater than the third etch rate.

4. The method of claim 3, wherein the etching of the original deposit comprises:

directing the etchant to each of the first and second surfaces at an oblique angle predetermined to create the second and third flow rates different from the first flow rate.

5. The method of claim 1, wherein the coating of the interior surface with said layer of CM without closing off the channel comprises:

depositing a seed layer of CM onto the interior surface; and growing the seed layer by conformal plating or butterfly-mode pulse reverse plating to form said layer of CM.

6. The method of claim 5, wherein the seed layer is deposited onto the interior surface by electroless plating.

7. The method of claim 1, wherein the CM is deposited onto the butterfly-shaped deposit by blind via filling.

8. The method of claim 1, wherein the CM is metal or a metallic alloy.

9. The method of claim 1, wherein the CM is copper or an alloy comprising copper.

10. A process for filling plural through holes (THs) in a substrate with a conductive material (CM), the substrate having a first surface and a second surface opposite thereto, an individual TH having an interior surface, a first end on the first surface, a second end on the second surface, and a mid-section in the middle of the individual TH, wherein:
the filling process comprises filling each of the THs with the CM according to the method of claim 1; and
the THs are filled concurrently.

11. A method for filling a through hole (TH) in a substrate with a conductive material (CM), the substrate having a first surface and a second surface opposite thereto, the TH having an interior surface, a first end on the first surface, a second end on the second surface, and a mid-section in the middle of the TH, the method comprising:
coating the interior surface with a layer of CM without closing off a channel of the TH between the first and second ends;
forming, on the interior surface, a butterfly-shaped deposit of CM from the layer of CM by recursively performing an etch-and-deposit process until the channel is closed; and
depositing the CM onto the butterfly-shaped deposit to completely fill the TH;
wherein the etch-and-deposit process for forming a next deposit of CM from an original deposit of CM comprises:
differentially etching the original deposit with a non-uniform distribution of etch rate along a height of the TH such that a first etch rate at the first end and a second etch rate at the second end are greater than a third etch rate at the mid-section, whereby an intermediate deposit of CM is obtained; and
depositing CM onto the intermediate deposit to form the next deposit by an electrodeposition process having a deposition rate at the mid-section not less than deposition rates at the first end and at the second end, so that in comparison between the next and original deposits, an amount of CM growth at the mid-section is greater than both amounts of CM growth at the first end and at the second end.

12. The method of claim 11, wherein the CM is deposited onto the intermediate deposit by conformal plating.

13. The method of claim 12, wherein the TH is substantially cylindrical in shape, and has an aspect ratio, given by the height of the TH to a diameter of the first end, between two to three inclusively.

14. The method of claim 11, wherein the CM is deposited onto the intermediate deposit by butterfly-mode pulse reverse plating.

15. The method of claim 14, wherein the TH is substantially cylindrical in shape, and has an aspect ratio, given by the height of the TH to a diameter of the first end, between four to five inclusively.

16. The method of claim 11, wherein:
the original deposit is differentially etched by a liquid etchant; and
the non-uniform distribution of etch rate is generated by agitating the etchant, the agitating of the etchant being configured to create a first flow rate of etchant at the mid-section different from a second flow rate of etchant at the first end and a third flow rate of etchant at the second end such that both the first and second etch rates are greater than the third etch rate.

17. The method of claim 16, wherein the etching of the original deposit comprises:
directing the etchant to each of the first and second surfaces at an oblique angle predetermined to create the second and third flow rates different from the first flow rate.

18. The method of claim 11, wherein the coating of the interior surface with said layer of CM without closing off the channel comprises:
depositing a seed layer of CM onto the interior surface; and
growing the seed layer by conformal plating or butterfly-mode pulse reverse plating to form said layer of CM.

19. The method of claim 18, wherein the seed layer is deposited onto the interior surface by electroless plating.

20. The method of claim 11, wherein the CM is deposited onto the butterfly-shaped deposit by blind via filling.

* * * * *